United States Patent
Voisine et al.

(10) Patent No.: US 9,829,517 B2
(45) Date of Patent: Nov. 28, 2017

(54) SERVICE SWITCH WITH HIGH CURRENT ARC PROTECTION

(71) Applicant: Landis+Gyr, Inc., Lafayette, IN (US)

(72) Inventors: John T. Voisine, Lafayette, IN (US); Wojciech Janczak, Lafayette, IN (US); Ronald C. Tate, Battle Ground, IN (US)

(73) Assignee: Landis+Gyr LLC, Lafayette, IN (US)

( * ) Notice: Subject to any disclaimer, the term of this patent is extended or adjusted under 35 U.S.C. 154(b) by 554 days.

(21) Appl. No.: 14/495,520

(22) Filed: Sep. 24, 2014

(65) Prior Publication Data
US 2016/0084884 A1    Mar. 24, 2016

(51) Int. Cl.
*G01R 22/06*    (2006.01)

(52) U.S. Cl.
CPC .......... *G01R 22/065* (2013.01); *G01R 22/063* (2013.01)

(58) Field of Classification Search
CPC ...... G01R 1/071; G01R 21/133; G01R 11/24; G01R 22/065; G01R 22/063
USPC .......... 324/118–143, 435, 500, 723, 714, 74, 324/103 R, 114
See application file for complete search history.

(56) References Cited

U.S. PATENT DOCUMENTS

| | | | | |
|---|---|---|---|---|
| 5,376,776 A | * | 12/1994 | Paese | .................... G06M 1/028 235/117 R |
| 2013/0098744 A1 | * | 4/2013 | Therrien | .................. H01H 1/26 200/52 R |

* cited by examiner

*Primary Examiner* — Melissa Koval
*Assistant Examiner* — Trung Nguyen
(74) *Attorney, Agent, or Firm* — Maginot, Moore & Beck LLP

(57) ABSTRACT

An arrangement for use in a utility meter includes an actuator element configured for linear movement. The actuator is operably coupled to receiving moving power from a prime mover, and includes a plurality of receptacles for corresponding contact arms of a switch within an electricity meter. Each receptacle is defined by an outer bar, an inner bar, and opposing stiffening elements. The outer bar is configured to engage a first surface of a contact arm element when the switch is in a first position, and the inner bar configured to engage a second surface of the contact arm element when the switch is in a second position.

20 Claims, 7 Drawing Sheets

SERVICE SWITCH WITH HIGH CURRENT ARC PROTECTION

FIELD OF THE INVENTION

The present invention relates to utility meters having electrical service disconnect features.

BACKGROUND

Electrical service providers such as electrical utilities employ electricity meters to monitor energy consumption by customers (or other entities). Electricity meters track the amount of energy consumed by a load (e.g. the customer), typically measured in kilowatt-hours ("kwh"), at each customer's facility. The service provider uses the consumption information primarily for billing, but also for resource allocation planning and other purposes.

Electrical power is transmitted and delivered to load in many forms. For example, electrical power may be delivered as polyphase wye-connected or delta-connected power or as single phase power. Such various forms are known as service types. Different standard electricity meter types, known as meter forms, are used to measure the power consumption for the various service types. The commonly used meter forms in the United States include those designated as 2S, 3S, 5S, 45S, 6S, 36S, 9S, 16S, 12S and 25S meter forms, which are well known in the art.

Electrical service providers have historically billed for electrical service in arrears, using information stored within the electricity meter to determine the amount of each invoice. In a typical operation, the electricity meter stores a value representative of the amount of energy consumed in a mechanical or electronic accumulation register. From time to time, the electrical service provider obtains the value of the register and bills the customer accordingly. For example, a meter reader employed by the service provider may, each month, physically read the register value off of a meter display. The service provider then employs the obtained register value to determine the amount of electricity consumed over the month and bills the customer for the determined amount.

A problem with the above-described operation of electrical service providers arises from the fact that some customers are frequently delinquent in or, in default of, payments for electricity consumption. Because electrical service is billed in arrears, delinquent payments can result in significant losses for the service provider. In many cases, the utility must interrupt power to prevent additional losses. However, interrupting the delivery of electrical power has historically been an expensive and significant event. Typically, a technician must be dispatched to the customer's residence, or in the vicinity thereof, to physically disconnect the power. Accordingly, while the electrical service provider can justify physically disconnecting the power to the customer's facility after several months of default, physical disconnection is not practical in circumstances in which customers are merely delinquent, or can only pay portions of their bills. In particular, the cost and effort of sending a technician out to disconnect electrical service is wasted if the customer pays a day or two later, thereby requiring another service call to restore service.

One method of controlling losses associated with risk of non-payment is to require prepayment for services. In prepayment arrangements, customers use prepaid debit cards or credit cards to "purchase" energy in advance. When the purchased energy has been consumed, the electrical service is disconnected. Thus, the service provider is not exposed to extended periods of electrical service for which no payment may be provided. Another method of handling delinquent customers is to intermittently interrupt power to delinquent customers until the past due payments are made. Intermittent interruptions tend to reduce the amount of energy consumed by the delinquent payor, thus advantageously reducing utility provider losses while also reducing bills to the delinquent payor.

Each of the above methods, however, typically requires the ability to disconnect and/or reconnect the customer's power without a technician service call to the customer's location. For example, in a prepayment scenario, the service provider must have a method of disconnecting power once the prepaid amount of energy has been consumed. Similarly, the intermittent interruption technique requires frequent connection and disconnection of the electrical service.

One technique for automated or remote service disconnection is to employ a service switch device within an electricity meter. The service switch is a relay or other switching element that controllably disconnects and reconnects the utility power lines to the customer's feeder lines, thereby controllably interrupting power to the customer's facility. In some cases, the service switch is tripped by a remote device that communicates with the electricity meter circuitry through a modem, radio or the like. Alternatively, such as in the case of prepayment, the meter itself may be programmed to disconnect and reconnect electrical service under certain circumstances. In some situations, the meter may disconnect and restore electrical service through a combination of local programming and remote commands.

Thus, the inclusion of a service switch within a meter facilitates various methods and techniques for providing improved electrical service to parties despite poor payment records. Such methods and techniques advantageously do not require a permanent disconnection by a field technician.

The conveniences provided by a service switch also extend beyond use in connection with high-risk payors. For example, electrical energy rationing may be implemented using techniques enabled by the service switch. Moreover, service disconnect features are often employed within so-called "Smart Meters". The term "Smart Meter" has been used to describe electricity metering systems that use a wide area network (WAN) or the like to enable communication and control over networks of meters. The WAN is used to communicate with "Smart Meters" for purposes of obtaining energy information and to operate the service switch. The WAN can also be used to reprogram the electricity meter. Communication with the "Smart Meter" is an essential element in managing the electrical power grid. An essential element of the "Smart Grid" is the "Smart Meter".

An issue that arises with service switches, however, relates to the meter's handling of large current spikes, such that those associated with a lightning strike or other anomaly. While failure of the meter under such extreme conditions cannot always be avoided, it is also paramount that any failure under extreme high current conditions be as graceful as possible.

In the past service switches have been operated by motor-driven actuators. These actuators included spring loaded contacts that ensured a high current, low resistance coupling of the customer load to the power lines. In some cases, however, a high current event under some circumstances causes separation of the contacts of the power switch, resulting in an arc between the contacts. Arcs can cause undesirable failure modes in an electricity meter.

There is a need, therefore, for an arrangement for providing service disconnect in an electricity meter that provides increased protection against undesirable high current event failure modes.

SUMMARY OF THE INVENTION

At least some embodiments of the present invention address the above described need, as well as others, by providing an arrangement that includes an actuator element for use in connection with switch contacts that inhibits inadvertent opening of the switch.

A first embodiment is an arrangement for use in a utility meter that includes an actuator element configured for linear movement. The actuator is operably coupled to receiving moving power from a prime mover, and includes a plurality of receptacles for corresponding contact arms of a switch within an electricity meter. Each receptacle is defined by an outer bar, an inner bar, and opposing stiffening elements. The outer bar is configured to engage a first surface of a contact arm element when the switch is in a first position, and the inner bar configured to engage a second surface of the contact arm element when the switch is in a second position.

The use of bars and stiffening elements for the receptacle of the switch contact arm elements help secure and protect the switch elements from destructive separation in the event of a high current event, among other things.

The above described features and advantages, as well as others, will become more readily apparent to those of ordinary skill in the art by reference to the following detailed description and accompanying drawings.

DETAILED DESCRIPTION

Figure 1:
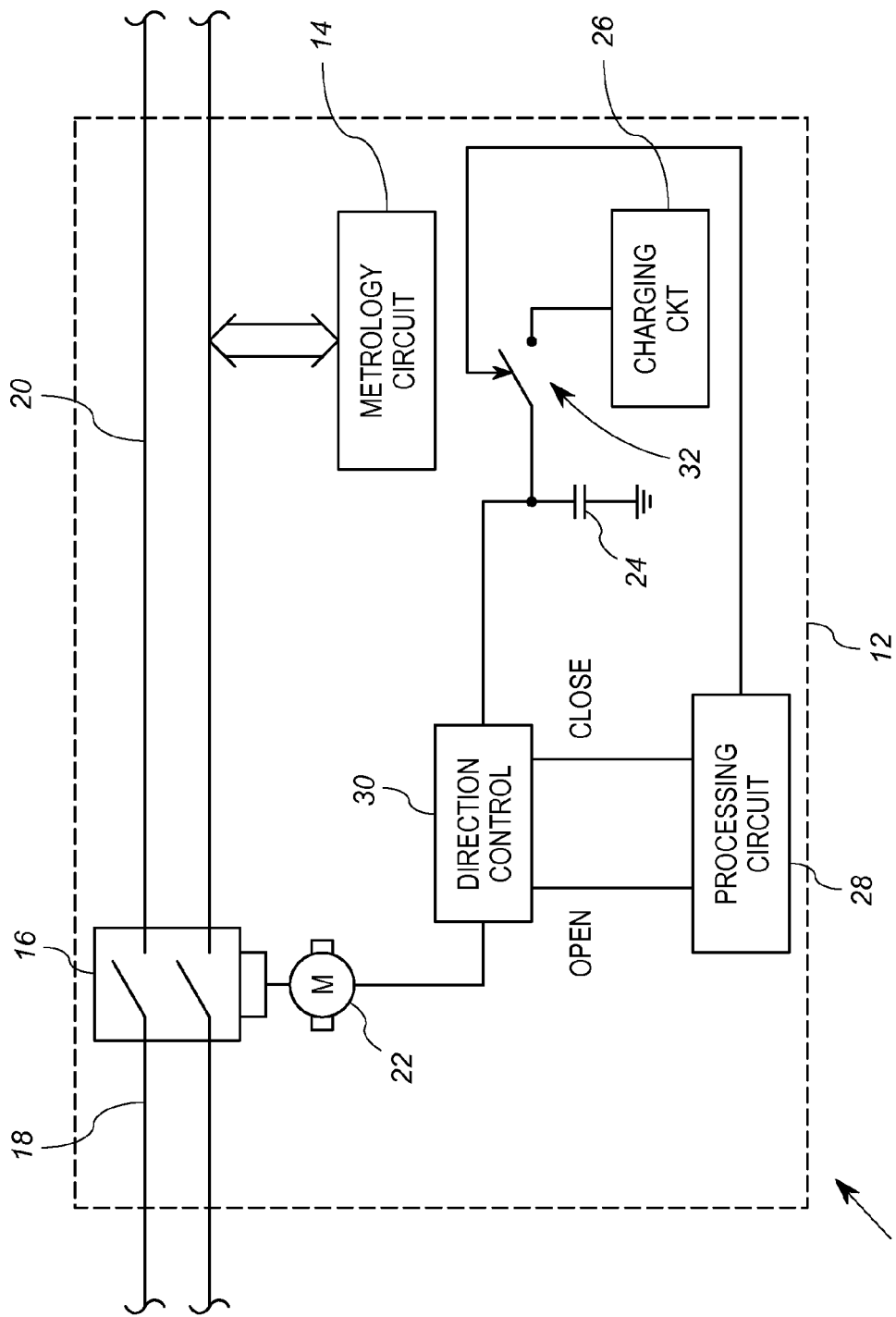
FIG. 1 shows a schematic block diagram of an exemplary arrangement for disconnecting utility power from load in an electricity meter according to the present disclosure.

FIG. 1 shows schematic block diagram of an arrangement 10 for controllably disconnecting a utility power service from a load. The arrangement 10 includes a utility meter housing 12 in which is supported metrology circuitry 14 that is configured to generate metering information regarding electrical power provided to the load. The electric utility, not shown, provides electrical power via line side conductors 18 to that arrangement 10. The load side conductors or feeder lines 20 distribute the power received from the line side conductors 18 to the load, not shown. The load may suitably be the electrical system of a residential, commercial or industrial facility.

The arrangement 10 further includes a service switch 16, an electrically powered source of motive force 22, an energy storage device 24, a charging circuit 26, a processing or control circuit 28, a direction control circuit 30, and a linkage assembly 34, all of which are supported in or on the housing 12. It will be appreciated that the housing 12 further can support other meter circuitry, not shown in FIG. 1.

The metrology circuit 14 is any suitable circuit that detects, measures, and determines one or more electricity and/or electrical energy consumption values based on energy flowing from the line-side conductors 18 to the load-side conductors 20. Such circuits are known in the art and can take many forms. A non-limiting example of a suitable metrology circuit is described below U.S. Patent Publication No. 2013/0093418, which is incorporated herein by reference.

The service switch 16 is one or more switches configured to controllably interrupt a connection between the utility power service and the load. To this end, the service switch 16 has terminals connected in series between the line side power conductors 18 and the load side power conductors 20. The electrically-powered source of motive force 22 has an output that is configured to cause, via the linkage assembly 34, the service switch 16 to controllably interrupt, and controllably reconnect, the connection between the conductors 18 and 20. In the embodiment described herein, the electrically-powered source of motive force 22 is a DC motor. The linkage assembly 34 includes an actuator element, not shown in FIG. 1, having features configured to inhibit opening of the service switch 16 during certain high current events. Further detail regarding the linkage assembly 34 is described below in connection with FIGS. 2-6.

In order to operate the source of motive force 22, an energy storage device 24 is configured to provide power thereto. In particular, while the meter in which the arrangement 10 is disposed also contains a power supply, not shown in FIG. 1, the normal meter power supply lacks sufficient power to cause the source of motive force 22 to open the switch 16. Accordingly, the energy storage device 24 acts as a temporary power boost or source that energizes the motive force device 22 sufficiently to open the switch 16. To this end, the energy storage device 24 may suitably be one or more capacitors, for example, aluminum electrolytic capacitors.

The charging circuit 26 is a circuit configured to provide a charging current to the energy storage device 24. Such circuits may take many forms. The charging circuit 26 is operably coupled to the energy storage device 24 via a switch 32. A non-limiting example of a suitable charging circuit and description of its operation is described in U.S. patent application Ser. No. 12/911,715, filed Oct. 25, 2010, which is assigned to the assignee of the present invention and which is incorporated herein by reference.

The direction control circuit 30 controllably connects the energy storage device 24 to the source of motive force 22. More specifically, the direction control circuit 30 is operably coupled to controllably provide current from the energy storage device 24 to the source of motive force 22 in two modes. In the first mode, the direction control circuit 30 provides current that causes the source of motive force 22 to rotate in a first direction (to open switch 16), and in the second mode the direction control circuit 30 provides current that causes the source of motive force 22 to rotate in a second direction (to close switch 16). To this end, the direction control circuit 30 includes at least a first switch in the form of a transistor switch. However, it will be appreciated that the direction control circuit 30 need not take any specific format, so long as it includes a switch that can be controllably operated to connect the energy storage device 24 to the source of motive force 22 to at least cause the source of motive force 22 to open the switch.

As will be discussed below in connection with FIG. 2, the linkage assembly 34 translates the rotational output movement of the source of motive force 22 to a linear force that moves switch contacts to make and break the electrical connection through the switch 16. It will be appreciated, however, that another source of motive force, including a source of direct linear movement such as a solenoid, may be employed in alternative embodiments.

In any event, the control circuit 28 is operably coupled to the direction control circuit 30 to cause the direction control circuit 30 to operate in the first mode, the second mode, or a third mode in which the energy storage device 24 is operably disconnected from the source of motive force 22. To this end, the control circuit 28 is configured to provide an OPEN signal to the direction control circuit 30 (and at least one switch thereof) to cause operable connection of the energy storage device 24 to the electrically powered source of motive force 22 in the first mode. The control circuit 28 is further configured to provide a CLOSE signal to the direction control circuit 30 to cause operable connection of the energy storage device 24 to the electrically powered source of motive force 22 in the second mode.

In this exemplary embodiment, the control circuit 28 is further operably coupled to the switch 32 that controllably and operably connects the energy storage device 24 to the charging circuit 26. The switch 32 may suitably be an electronic device that operably connects the charging circuit 26 to the energy storage device 24. By "operably connects", it means that the switch 32 causes the charging circuit 26 to provide charging current to the energy storage device 24. The switch 32 also controllably disconnects the charging circuit 26 from the energy storage device 24 by substantially preventing current from flowing from the charging circuit to the storage device 24. Controllably disconnecting can include disabling the output of the charging circuit 26. In such a case, controllably connecting can include enabling a previously disabled output of the charging circuit 26.

The control circuit 28 is configured to provide a signal to the switch 32 operably connecting the charging circuit 26 to the energy storage device 24.

The control circuit 28 is further configured to receive a disconnect command signal, for example, from a remote or external source through another circuit, not shown. The control circuit 28 is configured to provide, in sequence, the signal to the charging circuit 26, and then the OPEN signal to the direction control circuit 30, responsive to receiving the disconnect command signal. Conversely, the control circuit 28 is configured to provide, in sequence, the signal to the charging circuit 26, and then the CLOSE signal to the direction control circuit 30, responsive to a restore or reconnect command.

In normal energy delivery operation, the service switch 16 is closed, and the utility thereby provides electricity to the load via the line-side conductors 18 and the load-side conductors 20. The metrology circuit 14 senses or otherwise measures the electrical current flowing through the load-side conductors 20 and generates metering information therefrom. In such normal operation, the switch 32 is open, thereby operably disconnecting the charging circuit 26 form the energy storage device 24. Similarly, the direction control circuit 30 is configured such that neither an opening current nor a closing current is provided to source of motive force 22.

From time to time, it may be necessary for the electrical service to be disconnected from the load. In such a case, the control circuit 28 receives a command signal (i.e. a data signal with instruction data) from an external source indicating that the service is to be disconnected. To this end, the control circuit 28 is operably connected to a communication circuit, not shown, that receives signals from a remote transmitter. However, in a prepaid meter configuration, the control circuit 28 may generate the command signal internally upon determining that a prepaid amount of energy has been consumed.

Responsive to the command signal, the control circuit 28 generates a signal causing the switch 32 to operably connect the charging circuit 26 to the charge storage device 24. As a consequence, the charging circuit 26 charges the previously discharged charge storage device 24. After a short time sufficient to allow the charge storage device 24 to be charged, the control circuit 28 provides the OPEN signal to the direction control circuit 30. The OPEN signal causes the direction control circuit 30 to connect the charge storage device 24 to the source of motive force 22 such that the source of motive force 22 rotates in an "opening" direction. Such rotation is translated by the linkage assembly 34 to a motion that causes the switch 16 to move from the closed state to the open state.

Once the switch 16 is open, electrical energy cannot flow to the load-side conductor 20 from the line-side conductors 18. Thus, the electrical service has been disconnected from the load.

Once the disconnect operation is complete, the control circuit 28 removes the control signals from the direction control circuit 30 and the switch 32. As a consequence, the source of motive force 22 is disconnected from the energy storage device 24, and the energy storage device 24 is disconnected from the charging circuit 26. The linkage assembly 34 is further configured such that linear force from the switch 16 cannot be translated back to the source of motive force 22. In accordance with present invention, the linkage assembly 34 includes a structurally reinforced actuator that resists failure under high current conditions. (See FIGS. 2-6). Thus, the switch 16 is locked in the open position.

At some subsequent time, the control circuit 28 starts a process to reconnect or restore the electrical service to the load. The restoration process may commence responsive to a newly received command from an external source. Alternatively, software within the control circuit 28 may generate the command based on a predetermined amount of time passing since the disconnection, or based on receipt of information indicating further prepayment for services.

Responsive to the command signal, the control circuit 28 generates a signal causing the switch 32 to operably connect the charging circuit 26 to the charge storage device 24. As a consequence, the charging circuit 26 charges the previously discharged charge storage device 24. After a short time sufficient to allow the charge storage device 24 to be charged, the control circuit 28 provides a signal to the direction control circuit 30 that causes the direction control circuit 30 to connect the charge storage device 24 to the source of motive force 22 such that the source of motive force 22 rotates in a "closing" direction. Such rotation is translated by the linkage assembly 34 to a motion that causes the switch 16 to move from the open state to the closed state.

Once the switch 16 is closed, electrical energy again flows to the load-side conductor 20 from the line-side conductors 18. Thus, the load has its electrical service restored. As discussed above, the linkage assembly 34 is further configured such that linear force from the switch 16 cannot be translated back to the source of motive force 22. Thus, the switch 16 is locked in the closed position, even subject to forces caused by substantial overcurrent events.

One of the features of the embodiment of FIG. 1 is that the locking nature of the linkage assembly 34 operates to inhibit or prevent unintended separation of the contacts of the switch 34 due to high current, such as from a lightning strike. Another feature is the design of the actuator in the linkage assembly 34 to resist potentially explosive forces due to contact failure under extreme current conditions.

Figure 2:
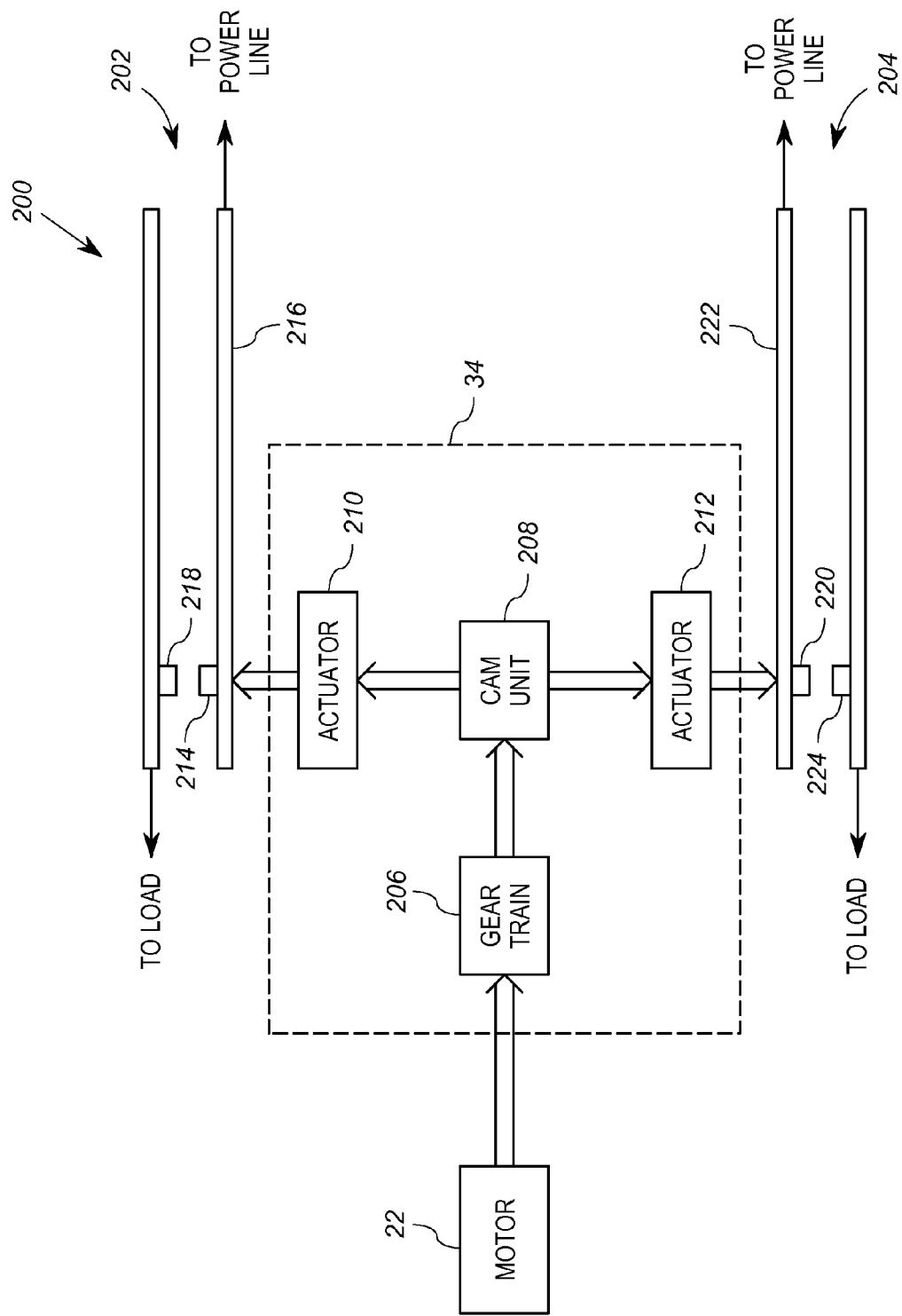
FIG. 2 shows a schematic view of further details of an exemplary arrangement for operating a service switch of the arrangement for disconnecting utility power of FIG. 1.

FIG. 2 shows a schematic diagram of an exemplary arrangement 200 for operating a service switch 16 that may be used in the arrangement 10 of FIG. 1. In FIG. 2, the service switch 16 includes a first switching device 202 and a second switching device 204, each configured to selectively connect and disconnect one of the two power lines 18 from the feeder lines 20. In this case, both switching devices 202, 204 are operably coupled to the same source of motive force 22, which in this case is a motor. However, it will be appreciated that in other embodiments, a single switching device may be employed, and/or multiple sources of motive force may be employed.

Figure 3A:
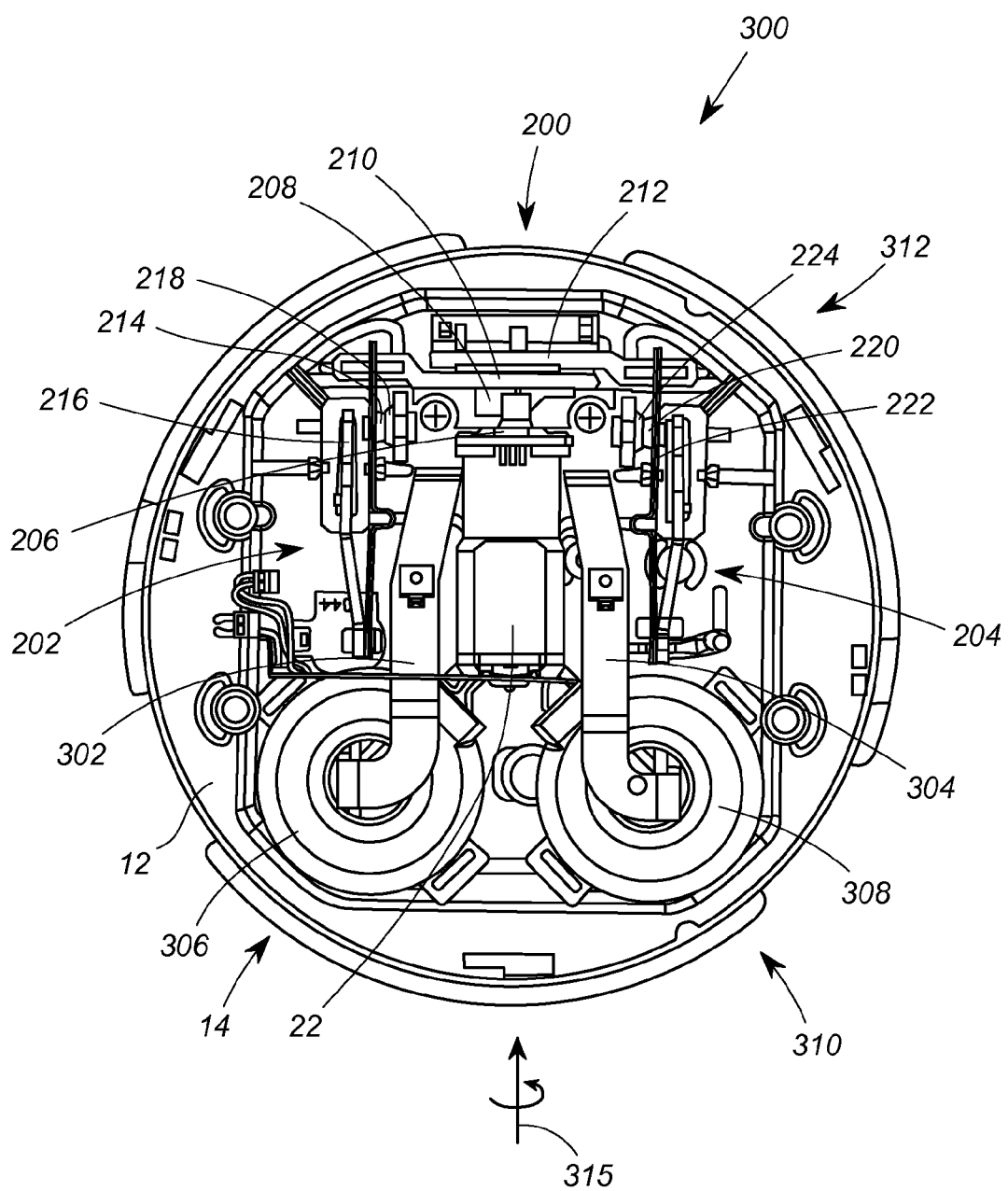
FIGS. 3a and 3b show a front plan view a portion of a meter including the arrangement of FIG. 2.
Figure 3B:
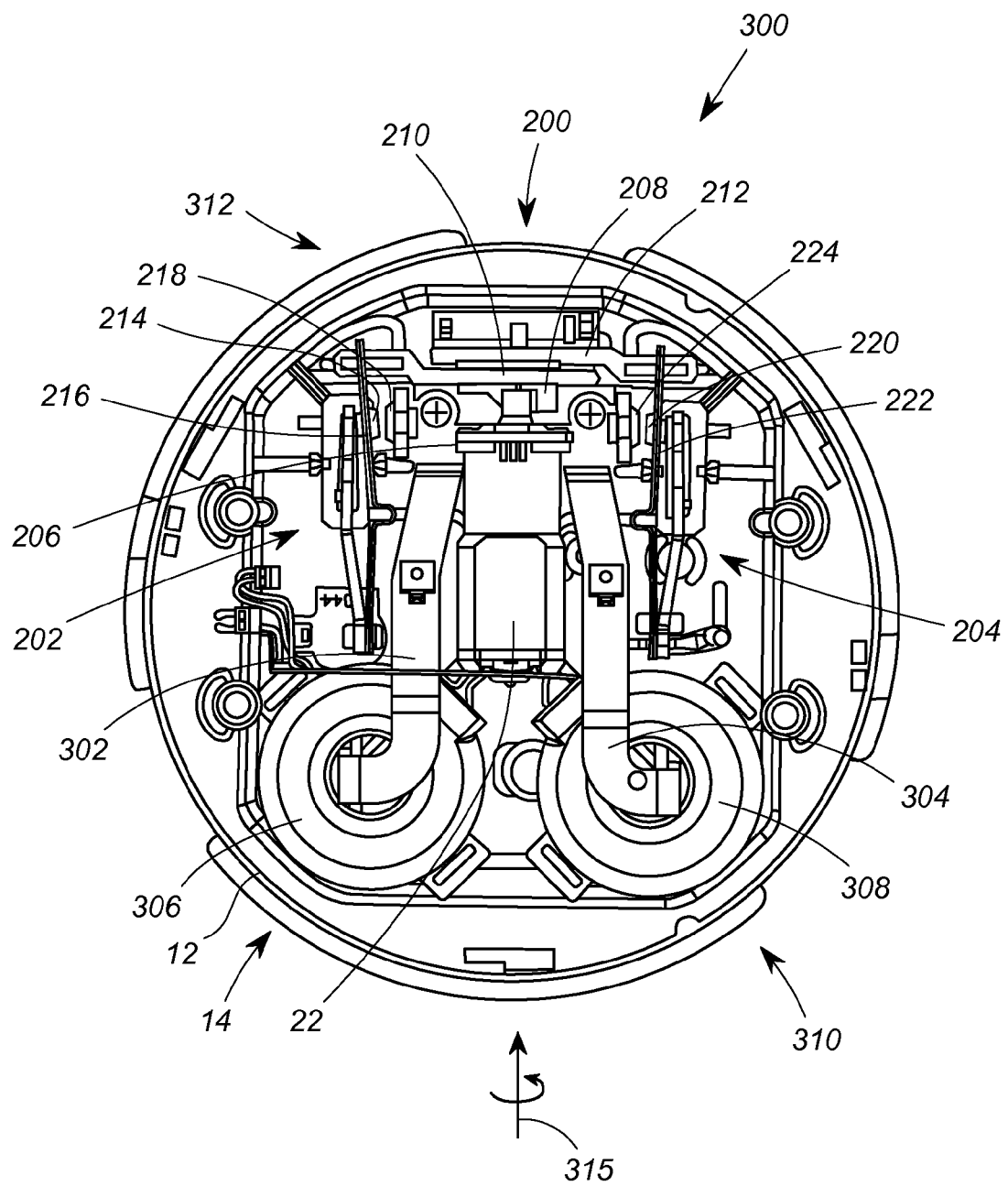
Figure 6:
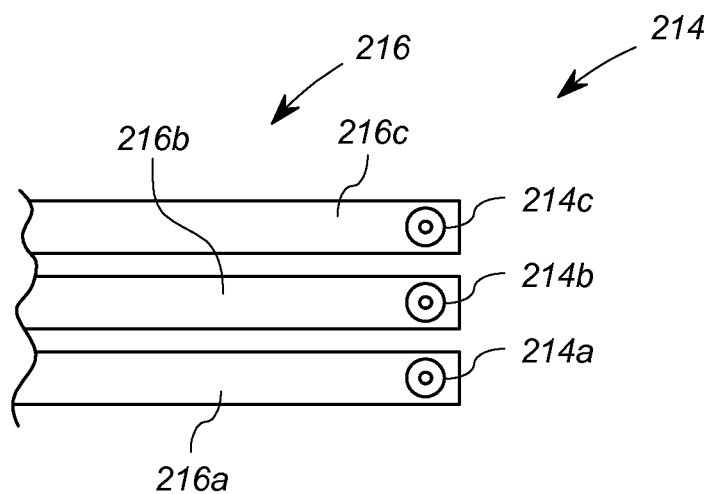
FIG. 6 shows a fragmentary plan view of a set of moveable contacts and corresponding contact arms of the arrangement of FIG. 2.

The first switching device 202 includes a moving contact 214, a contact arm 216, and a stationary contact 218. Similarly, the second switching device 204 includes its own moving contact 220, contact arm 222 and stationary contact 224. FIG. 6 shows in further detail the fragmentary plan view of the moving contact 214 and the contact arm 216 of the first switching device 202. As shown in FIG. 6, the moving contact 214 in this embodiment includes multiple contact elements 214a, 214b, 214c, each disposed on a corresponding contact arm element 216a, 216b, 216c of the contact arm 216. Each of contact arm elements 216a, 216b and 216c is thin bar of conductive metal, and the corresponding contact elements 214a, 214b and 214c are also conductive. In this embodiment, the contact elements 214a, 214b, 214c and arm elements 216a, 216b, and 216c are all electrically coupled. Correspondingly, each of the stationary contact 218, 224 may, but need not, be constructed of three mating elements. In FIGS. 3a and 3b, only one of the three elements of each of the contacts 218, 224 is shown. The moving contact 220 and contact arm 222 may suitably have the same structure.

Referring again to FIG. 2, the linkage assembly 34 in this embodiment includes a gear train 206, a cam unit 208 and first and second actuator elements 210, 212.

The motor 22 is operably connected to provide rotational force to the gear train 206. The gear train 206 translates the rotational force from the motor 22 to a slower rotation with improved torque. The output rotation force of the gear train 206 is provided to the cam unit 208. The cam unit 208 and actuator elements 210, 212 are configured to cooperate to translate the rotational force provided to the gear train 206 into a linear forces provided to the contact arms 216, 222. The linear force provided by the actuator 210 operates to open and close, depending on the direction, the first switching device 202, while the linear force provided by the actuator 212 operates to open and close, depending on the direction, the second switching device 204.

In particular, the linear force provided by the actuator 210 closes the first switching device 202 by moving at least a portion of the contact arm 216 (e.g. contact arm elements 216a, 216b, 216c) and moving contact 214 such that the moving contact 214 (e.g. contact elements 214a, 214b, 214c) is engaged with the stationary contact 218 (e.g. the three elements thereof). By contrast, the linear force provided by the actuator 210 opens the first switching device 202 by moving at least a portion of the contact arm 216 (e.g. contact arm elements 216a, 216b, 216c) and moving contact 214 such that the moving contact 214 is spaced apart from the stationary contact 224 (e.g. the three elements thereof). The actuator 212 is substantially identical and operates in substantially the same way as the actuator 210.

FIGS. 3a and 3b shows a top plan view of a portion 300 of an electricity meter that includes an arrangement 200 of FIG. 2. The meter portion 300 includes a bottom part of the meter housing 12, a part of the metrology circuit 14, and the arrangement 200 for operating the service switch devices 202, 204 which collectively make up the service switch 16. FIG. 3a shows the meter portion 300 wherein the service switch devices 202, 204 are closed, and electricity thereby delivered to the load/customer. FIG. 3b shows the meter portion 300 wherein the service switch device 202, 204 are open, thereby interrupting the delivery of electricity to the load/customer.

The portion of the metrology circuit 14 shown in FIGS. 3a and 3b includes first and second current coils 302, 304, and first and second current transformers 306, 308. The current coils 302, 304 are directly coupled to the load lines 20. The contact arms 216 and 222 are coupled to the utility power lines 18, not shown in FIGS. 3a, 3b. The current transformers 306, 308 are in a current sensing relationship with the current coils 302, 304. The current transformers 306, 308 are operably coupled to provide current measurement signals to other portions of the metrology circuit that are not shown in FIGS. 3a, 3b. The remainder of the metrology circuit 14 employs these signals, as well as voltage measurement signals, to perform energy consumption measurements in any conventional way.

The current coils 302, 304 in this embodiment are conductive bars that are securely mounted to the housing 12 and have been shaped such that they can carry current from a connection below the meter 10, through a corresponding one of the current transformers 306, 308, and to a respective stationary contact 218, 224 of the switch devices 210, 212. Suitable current coils are known and can take many forms.

The current coils 302, 304 in this embodiment extend in part lengthwise from a bottom area 310 to a top area 312 of the meter portion 300. The motor 22 has an axis of rotation 315 that is substantially parallel to, and disposed between the lengthwise extension of the current coils 302, 304. The gear train 206 is coupled to motor 22 and also extends along the same axial direction. The cam unit 208 is coupled to and is adjacent to the gear train 206, and has the same axis of rotation 315.

The actuator element 210 is operably coupled to the cam unit 208 at a body portion thereof, and the actuator 212 is similarly operably coupled to the cam unit 208 at a body portion thereof. Further detail regarding the body portion of the actuator elements 210 and 212 is provided further below in connection with FIGS. 5a, 5b.

Figure 4:
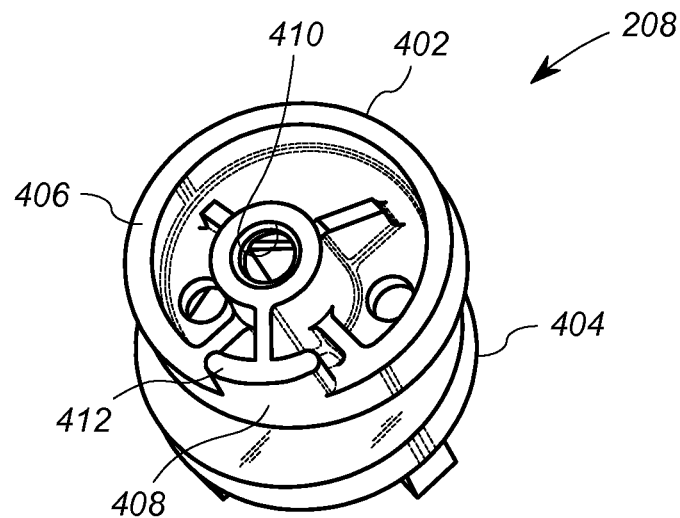
FIG. 4 shows a perspective view of an exemplary cam unit that may be used in the arrangement of FIG. 2.

FIG. 4 shows an exemplary embodiment of the cam unit 208. The cam unit 208 includes a first cam 402 and a second cam 404 fixedly coupled to each other. In this embodiment, the cam unit 208 is integrally formed. However, it will be appreciated the first cam 402 and second cam 404 may be affixed to each other in another way. In some embodiments, the first cam 402 and second cam 404 may be separate pieces. However, employing a cam unit 208 wherein the cams 402, 404 are fixedly coupled helps simplify ensuring their proper relative orientation.

The first cam 402 includes a round cam body 406 having a nose 408 and a central opening 410. The central opening 410 receives the output shaft of the gear train 206, not shown. The nose 408 defines a portion of the circumference of the round cam body 406 that is further from the central opening 410 than the other portions of the round cam body 406. Because the nose 408 extends further from the central opening 410, it provides a camming force on the cam followers of the actuator element 210, discussed further below. In this embodiment, the first cam 402 includes a stop structure 412 that extends axially from a part of the round cam body 406. The stop structure 412 is configured to engage with corresponding structural features of the meter housing 12, or another structure such as a motor mount, not shown, that stops the rotation of the cam 402 at a predetermined location.

The cam 404 has substantially the same structure. However, the nose of the cam 404, not shown, is disposed on the opposite side (180° out of phase) from the nose 408. As will be discussed further below, the opposite orientation of the noses of the cams 402, 404 allows cams 402, 404 to move the actuator elements 210, 212 in opposite directions for congruent opening and closing operations.

Figure 5A:
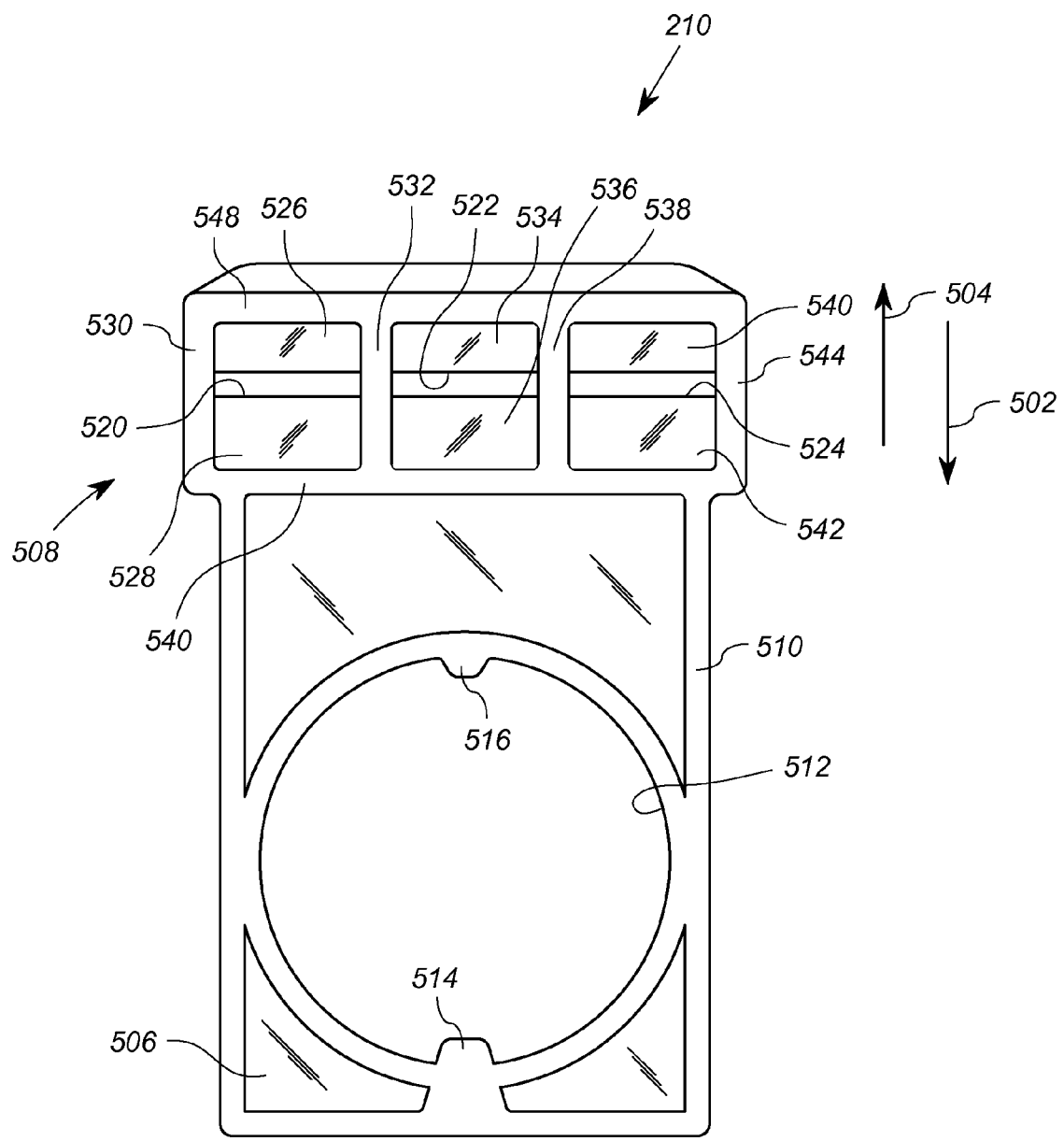
FIGS. 5a and 5b show different views of an exemplary actuator element of the arrangement of FIG. 2.
Figure 5B:
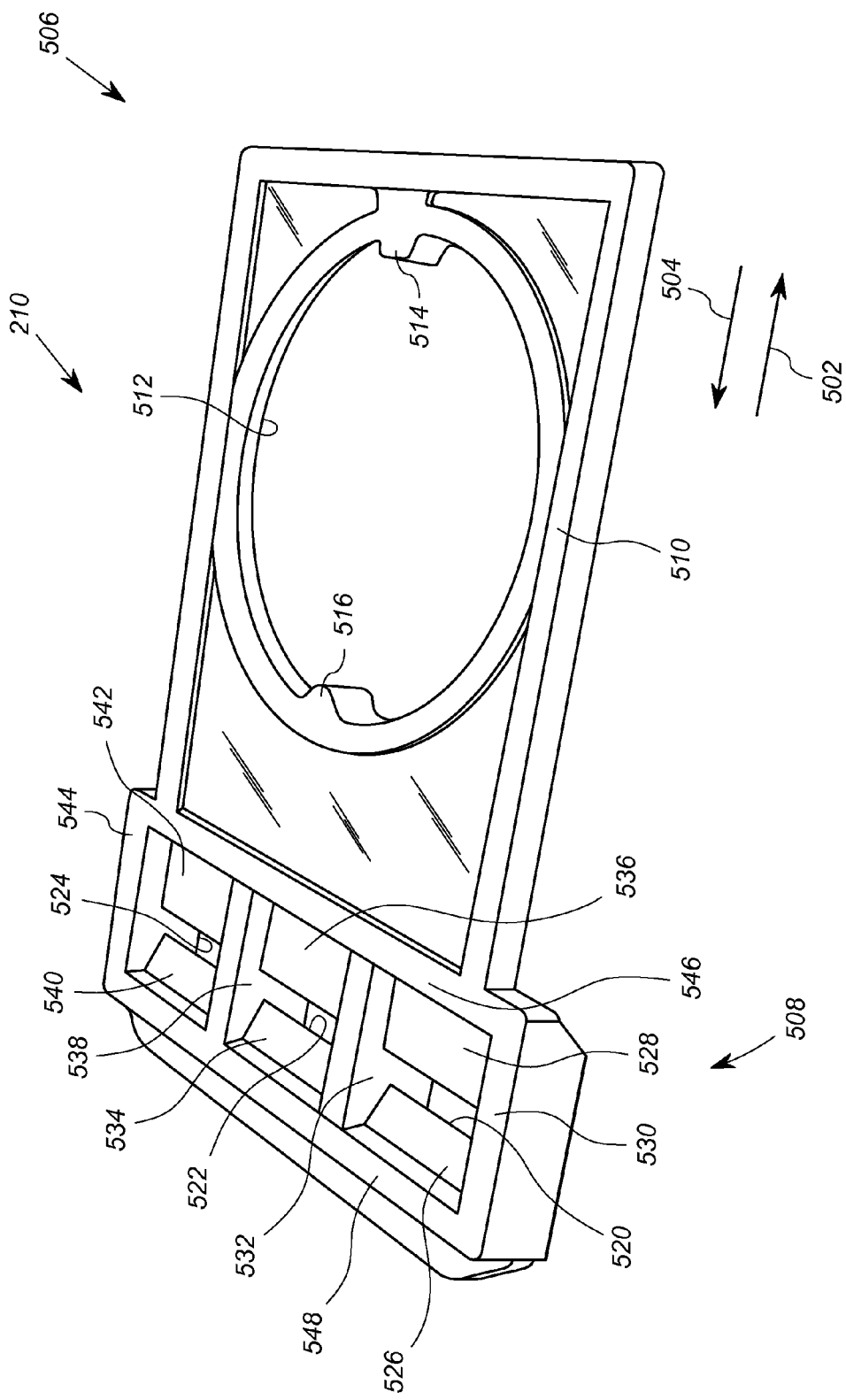

FIG. 5a shows a front plan view of the actuator element 210, and the FIG. 5b shows a perspective view of the actuator element 210. It will be appreciated that in FIGS. 3a and 3b, the actuator element 210 is shown substantially as a side plan view. Referring generally to FIGS. 2, 3a, 5a and 5b, the actuator 210 is configured for linear movement in a first direction 502 and a second direction 504. To this end, the actuator 210 includes a main body 506 and an operative body 508.

The main body 506 operably connected to receive moving power from the prime mover 22 via the gear train 206 and first cam 402. In particular, the main body 506 includes a frame 510 and a round opening 512 formed therein. The main body 506 further includes first and second cam followers 514, 516 extending into the opening 512. The first cam follower 514 is disposed at the furthest position in the first direction 502 of the opening 512. The second cam follower 516 is disposed at the furthest position in the second direction 504 of the opening 512. The opening 512 is configured to receive the first cam 402.

The operative body 508 is coupled to, and preferably integrally formed with, the main body 506. The operative body 508 is disposed at the furthest point in the second direction 504 on the frame 510. The operative body 508 defines a plurality of receptacles 520, 522, 524 which are configured to receive, respectively, contact arm elements 216a, 216b, 216c of the contact arm 216 (See, e.g., FIG. 6). The receptacle 520 is defined by an outer bar 526, an inner bar 528, and opposing stiffening elements 530, 532. The outer bar 526 is configured to engage a first surface of the contact arm element 216a when the switch 202 is in a first position (FIG. 3a). The inner bar 528 is configured to engage a second surface of the contact arm element 216a when the switch 202 is in a second position (FIG. 3b). The receptacle 522 is defined by a similar outer bar 534, a similar inner bar 536, and opposing stiffening elements 532, 538. The outer bar 534 is configured to engage the first surface of the contact arm element 216b when the switch 202 is in the first position (FIG. 3a). The inner bar 536 is configured to engage a second surface of the contact arm element 216b when the switch 202 is in a second position (FIG. 3b). In a similar manner, the receptacle 524 is defined by a similar outer bar 540, a similar inner bar 542, and opposing stiffening elements 538, 544. The outer bar 540 is configured to engage the first surface of the contact arm element 216c when the switch 202 is in the first position (FIG. 3a). The inner bar 542 is configured to engage a second surface of the contact arm element 216c when the switch 202 is in a second position (FIG. 3b).

The operative body 508 has a width defined by the outermost stiffening elements 530 and 544, which corresponds to collective widths of the contact arm elements 216a 216b, 216c of the switch 202. The operative body 508 also includes a first ledge 546 and a parallel second ledge 548, both of which extend across the width of the operative body 508. The outer bars 526, 534 and 540 extend in the first direction 502 from the second ledge 548 toward the plurality of receptacles 520, 522 and 524, and the inner bars 528, 536 and 542 extend in the second direction 504 from the first ledge 546 toward the plurality of receptacles 520, 522 and 524. The stiffening elements 530, 532, 538 and 544 extend from the first ledge 546 to the second ledge 548, adjacent to corresponding inner bars 528, 536 and 542, adjacent to corresponding receptacles 520, 522 and 524, and adjacent to corresponding outer bars 526, 534 and 540. Each of the stiffening elements 530, 532, 538 and 544 stands proud of the adjacent inner bars 528, 536 and 542 and the adjacent outer bars 526, 534 and 540 to provide strengthening rib structure.

It will be appreciated that the first ledge 546 also forms part of the frame 510 of the main body 506.

Referring again to FIGS. 2, 3a and 3b, the actuator 212 preferably has a structure that is substantially identical to that of the actuator 210.

The operation of the arrangement 200 of FIG. 2 will be described with general reference to FIGS. 2, 3a, 3b, 4, 5 and 6. During normal metering operation, the switches 202, 204 are in the closed position, such as shown in FIG. 3a. In such a position, electricity is delivered to the load through the meter 10. Referring to FIGS. 4 and 5, when closed, the nose 408 of the cam 402 is in a position that is aligned with the cam follower 514. In such a position, the actuator 210 is forced to its furthermost extreme in the first direction 502. In this position, the outer bar 526 forces contact arm element 216a in the first direction, thereby forcing and retaining the moving contact element 214a in contact with the stationary contact 218, as shown in FIG. 3a. Similarly, the outer bar 534 forces contact arm element 216b in the first direction, thereby forcing and retaining the moving contact element 214b in contact with the stationary contact 218, and the outer bar 540 forces contact arm element 216c in the first direction, thereby forcing and retaining the moving contact element 214c in contact with the stationary contact 218. The cam 404 similarly is positioned to force the actuator 212 into a similar position in which the moving contact 220 is forced against the stationary contact 224, as shown in FIG. 3a.

To open the switches 202, 204 in order to interrupt electrical service to the load, the motor 22 rotates, which rotates the cam unit 208. Referring to FIGS. 4 and 5, the rotation of the cam 402 of the cam unit 208 causes the nose 408 to move off of the cam follower 514 and rotate toward the cam follower 516. As the nose 408 moves off of the cam follower 514, tension is released between the outer bars 526, 534 and 540 and the contact arm elements 216a, 216b, 216c. However, the contact elements 214a, 214b and 214c are still in contact with the stationary element 218 due to slight biasing in the switch 202 itself. The cam 404 and the actuator 210 operate in the same way.

The motor 22 continues to rotate until the cam unit 208 is in its open position. Referring to FIGS. 4 and 5, in the open position, the nose 408 of the cam 402 is aligned with and engages the cam follower 516. In such position, the inner bar 528 forces contact arm element 216a in the second direction, thereby forcing the moving contact element 214a out of contact with the stationary contact 218, as shown in FIG. 3b. Similarly, the inner bar 536 forces contact arm element 216b in the second direction, thereby forcing the moving contact element 214b away from the stationary contact 218. Likewise, the inner bar 542 forces contact arm element 216c in the second direction, thereby forcing the moving contact element 214c away from and out of contact with the stationary contact 218. The cam 404 similarly is positioned to force the actuator 212 into a similar position in which the moving contact 220 is forced away from the stationary contact 224, as shown in FIG. 3b.

Referring again to FIG. 3a, one advantage of the embodiment described herein is the ability of the arrangement 200 to retain the switches 202, 204 in the closed position in the event of an extreme current event. During extreme current events, such as a lightning strike or load-side fault, it is known that small surface regions of the contacting elements of the moveable contacts 214, 220 and/or the stationary contacts 218, 224 can vaporize. In prior art devices, the force of the vaporization would urge the contacts 214 and 218 to separate and urge the contacts 220 and 224 to separate. The separation of the contacts of the switches 202, 204 could create a plasma arc within the meter 10, which would create an undesirable failure mode.

However, the design of the linkage assembly 34, and particularly the actuators 210 and 212, are configured to withstand the sudden, strong force associated with vaporizing contacts under high current conditions. The use of cams 402, 404 operate to securely lock the actuators 210, 212 in the closed position when the switches 202, 204 are closed. Thus, the force due to failure of the contacts cannot be translated back to the motor 22. The outer bars 526, 534 and 540, in cooperation with the ledges 546 and 548, maintain a strong and rigid force against the contact arm 216 to avoid separate of conductive material sufficient to create an arc. Moreover, the stiffening elements 530, 532, 538 and 544 cooperate with the ledges 546 and 548, among other things, to resist failure of the actuator 210 under extreme conditions.

It will be appreciated that the above described embodiments are merely exemplary, and that those of ordinary skill in the art may readily devise their own implementations and modifications that incorporate the principles of the invention and fall within the spirit and scope thereof.

What is claimed is:

1. An arrangement for use in a utility meter, comprising:
an actuator element configured for linear movement, the actuator operably coupled to receiving moving power from a prime mover, the actuator element including a plurality of receptacles for corresponding contact arms of a switch within an electricity meter, each receptacle defined by an outer bar, an inner bar, and opposing stiffening elements, the outer bar configured to engage a first surface of a contact arm element when the switch is in a first position, the inner bar configured to engage a second surface of the contact arm element when the switch is in a second position.

2. The arrangement of claim 1, wherein the actuator element further comprises:
a main body operably connected to receiving moving power from the prime mover; and
an operative body coupled to the main body, and wherein the plurality of receptacles are defined in the operative body.

3. The arrangement of claim 2, wherein the operative body has a width corresponding to collective widths of the contact arm elements of the switch, the operative body including:
a first ledge adjacent to the main body, the first ledge extending across the width;
a second ledge extending parallel to the first ledge; and
wherein each outer bar extends from the second ledge toward a corresponding one of the plurality of receptacles, and each inner bar extends from the first ledge toward a corresponding one of the plurality of receptacles.

4. The arrangement of claim 3, wherein the stiffening elements extend from the first ledge to the second ledge, each stiffening element extending alongside at least one inner bar and at least one outer bar, and adjacent at least one corresponding receptacle, wherein each of the stiffening elements stands proud of at least one inner bar and at least one outer bar.

5. The arrangement of claim 4, wherein the main body includes an outer frame, wherein the outer frame includes the first ledge.

6. The arrangement of claim 5, wherein the main body includes an interior opening within the frame operably configured to receive a cam.

7. The arrangement of claim 3, wherein the main body includes an outer frame, wherein the outer frame includes the first ledge.

8. The arrangement of claim 7, wherein the main body includes an interior opening within the frame operably configured to receive a cam.

9. The arrangement of claim 1, wherein:
the outer bar engages a first surface of the contact arm element when the switch is in a first position;
the inner bar engages a second surface of the contact arm element when the switch is in a second position; and
each of the contact arm elements is electrically conductive.

10. An arrangement for use in a utility meter, comprising:
a cam operably coupled to receive moving power from a prime mover;
an actuator element operably coupled to the cam unit such that movement of the cam unit causes linear movement of the actuator element, the actuator operably coupled to receiving moving power from a prime mover, the actuator element including at least a first receptacle for at least one corresponding contact arm of a switch within an electricity meter, the first receptacle defined by an outer bar, an inner bar, and opposing stiffening elements, the outer bar configured to engage a first surface of a contact arm element to force the contact arm element toward a first position when the actuator is moved in a first direction, the inner bar configured to engage a second surface of the contact arm element to force the contact arm element toward a second position when the actuator is moved in a second direction.

11. The arrangement of claim 10, wherein the actuator element further comprises:
a main body operably coupled to receiving moving power from the cam; and
an operative body coupled to the main body, and wherein the first receptacle is defined in the operative body.

12. The arrangement of claim 11, wherein the operative body has a width, the operative body including:
a first ledge adjacent to the main body, the first ledge extending across the width;
a second ledge extending parallel to the first ledge; and wherein the outer bar extends from the second ledge toward the first receptacle, and the inner bar extends from the first ledge toward the first receptacle.

13. The arrangement of claim 12, wherein the stiffening elements extend from the first ledge to the second ledge, each stiffening element extending alongside the inner bar and the outer bar, and adjacent the first receptacle, wherein each of the stiffening elements stands proud of the inner bar and the outer bar.

14. The arrangement of claim 13, wherein the main body includes an outer frame, wherein the outer frame includes the first ledge.

15. The arrangement of claim 14, wherein the main body includes an interior opening within the frame operably configured to receive the cam, and further includes two cam followers extend into the interior opening.

16. The arrangement of claim 13, wherein the main body includes an outer frame, wherein the outer frame includes the first ledge.

17. The arrangement of claim 16, wherein the main body includes an interior opening within the frame operably configured to receive a cam.

18. An arrangement for use in a utility meter, comprising:
an actuator element configured for linear movement, the actuator operably coupled to receiving moving power from a prime mover, the actuator element including a plurality of receptacles for corresponding contact arms of a switch within an electricity meter, each receptacle defined by an outer bar, an inner bar, the outer bar configured to engage a first surface of a contact arm element when the switch is in a first position, the inner bar configured to engage a second surface of the contact arm element when the switch is in a second position; and
a cam operably coupled between a source of motive force and the actuator element, the cam configured to lock the arrangement to inhibit translation of a linear force on the actuator element back to the source of motive force.

19. The arrangement of claim 18, further comprising a motor, and wherein the source of motive force is the motor.

20. The arrangement of claim 18, wherein each of the contact arm elements is electrically conductive.

* * * * *